(12) United States Patent
Gwon et al.

(10) Patent No.: US 12,061,757 B2
(45) Date of Patent: Aug. 13, 2024

(54) DISPLAY APPARATUS WITH INTEGRATED TOUCH SCREEN AND METHOD OF MANUFACTURING THE SAME

(71) Applicant: LG DISPLAY CO., LTD., Seoul (KR)

(72) Inventors: Hyangmyoung Gwon, Paju-si (KR); Minjoo Kim, Seoul (KR); Sungjin Kim, Seoul (KR); Jaehyung Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/196,493

(22) Filed: May 12, 2023

(65) Prior Publication Data

US 2023/0289004 A1    Sep. 14, 2023

Related U.S. Application Data

(63) Continuation of application No. 17/566,170, filed on Dec. 30, 2021, now Pat. No. 11,687,181, which is a
(Continued)

(30) Foreign Application Priority Data

Jun. 30, 2017    (KR) .................. 10-2017-0083737

(51) Int. Cl.
*G06F 3/041*    (2006.01)
*G06F 3/044*    (2006.01)
(Continued)

(52) U.S. Cl.
CPC .......... *G06F 3/0412* (2013.01); *G06F 3/0416* (2013.01); *G06F 3/04166* (2019.05);
(Continued)

(58) Field of Classification Search
CPC .. G06F 3/0412; G06F 3/04166; G06F 3/0443; G06F 3/0416; G06F 3/044;
(Continued)

(56) References Cited

U.S. PATENT DOCUMENTS

2011/0006998 A1    1/2011    Kang et al.
2014/0184948 A1    7/2014    Park et al.
(Continued)

FOREIGN PATENT DOCUMENTS

CN    10-2483660 A    5/2012
CN    10-3151467 A    6/2013
(Continued)

OTHER PUBLICATIONS

Korean Office Action dated Apr. 28, 2021 issued in corresponding Patent Application No. 10-2017-0083737 (4 pages).
(Continued)

*Primary Examiner* — Kwin Xie
(74) *Attorney, Agent, or Firm* — POLSINELLI PC

(57) ABSTRACT

Disclosed are a display apparatus with integrated touch screen and a method of manufacturing the display apparatus, which prevent short circuit between touch electrodes. The display apparatus with integrated touch screen including a light emitting layer disposed on a substrate, an encapsulation layer disposed on the light emitting layer, a plurality of touch electrodes disposed on the encapsulation and spaced apart from each other, and an upper PAC layer disposed on the plurality of touch electrodes. The upper PAC layer is patterned to be disposed on the plurality of touch electrodes.

11 Claims, 4 Drawing Sheets

Related U.S. Application Data continuation of application No. 17/024,549, filed on Sep. 17, 2020, now Pat. No. 11,243,630, which is a continuation of application No. 16/023,305, filed on Jun. 29, 2018, now Pat. No. 10,817,090.

(51) Int. Cl.
  *H10K 50/844* (2023.01)
  *H10K 59/12* (2023.01)
  *H10K 59/40* (2023.01)
  *H10K 71/00* (2023.01)
  *H10K 102/00* (2023.01)

(52) U.S. Cl.
  CPC ............ *G06F 3/044* (2013.01); *G06F 3/0443* (2019.05); *H10K 59/12* (2023.02); *H10K 71/00* (2023.02); *G06F 2203/04103* (2013.01); *H10K 50/844* (2023.02); *H10K 59/1201* (2023.02); *H10K 59/40* (2023.02); *H10K 2102/341* (2023.02)

(58) Field of Classification Search
  CPC ...... G06F 2203/04103; H10K 59/1201; H10K 59/40; H10K 50/844; H10K 71/00; H10K 59/12; H10K 2102/341
  USPC .................................................. 345/173–174
  See application file for complete search history.

(56) References Cited

U.S. PATENT DOCUMENTS

| | | |
|---|---|---|
| 2014/0190807 A1 | 7/2014 | Xie et al. |
| 2015/0062067 A1* | 3/2015 | Hong .................... G06F 3/0412 345/174 |
| 2015/0261258 A1 | 9/2015 | Kim et al. |
| 2015/0261370 A1 | 9/2015 | Yoo et al. |
| 2015/0372028 A1 | 12/2015 | Lee et al. |
| 2016/0154499 A1* | 6/2016 | Bae ....................... G06F 3/0446 345/174 |
| 2016/0320885 A1 | 11/2016 | Kim et al. |
| 2017/0263887 A1* | 9/2017 | Han ...................... H10K 50/844 |
| 2017/0288007 A1* | 10/2017 | Shin ........................ H10K 71/00 |
| 2018/0026225 A1* | 1/2018 | Kwon ................... H10K 59/873 257/40 |
| 2018/0047938 A1* | 2/2018 | Kishimoto ........... H10K 77/111 |
| 2018/0151597 A1* | 5/2018 | Yamazaki ........... G06F 3/04166 |
| 2018/0158894 A1 | 6/2018 | Park et al. |
| 2018/0197924 A1* | 7/2018 | Tada ..................... H10K 71/00 |
| 2018/0226454 A1 | 8/2018 | Liu et al. |

FOREIGN PATENT DOCUMENTS

| | | |
|---|---|---|
| CN | 10-3197785 A | 7/2013 |
| CN | 20-3386169 U | 1/2014 |
| CN | 10-5867710 A | 8/2016 |
| CN | 10-6708342 A | 5/2017 |
| CN | 10-6775173 A | 5/2017 |
| EP | 2 960 962 A1 | 12/2015 |
| EP | 2991116 A1 | 3/2016 |
| KR | 10-2011-0061746 A | 6/2011 |
| KR | 10-2016-0043230 A | 4/2016 |
| KR | 10-2016-0072336 A | 6/2016 |
| KR | 20160124301 A | 10/2016 |
| KR | 2016-0127873 A | 11/2016 |
| TW | 2017-03249 A | 1/2017 |

OTHER PUBLICATIONS

Counterpart Chinese Office Action dated Jan. 11, 2021 issued in Chinese Patent Application No. 201810722261.2 (8 pages).
Korean Office Action dated Nov. 1, 2022 issued in Patent Application No. 10-2022-0096352 (4 pages).
Indian Office Action dated Dec. 22, 2023 issued in Patent Application No. 201814024089 (3 pages).
Korean Office Action dated Jun. 26, 2023 issued in Patent Application No. 10-2023-0076158 (5 pages).

* cited by examiner

DISPLAY APPARATUS WITH INTEGRATED TOUCH SCREEN AND METHOD OF MANUFACTURING THE SAME

CROSS-REFERENCE TO RELATED APPLICATIONS

This application is a continuation application of U.S. patent application Ser. No. 17/566,170, filed on Dec. 30, 2021, which is a continuation application of U.S. patent application Ser. No. 17/024,549, filed on Sep. 17, 2020, now U.S. Pat. No. 11,243,630, issued on Feb. 8, 2022, which is a continuation application of U.S. patent application Ser. No. 16/023,305, filed on Jun. 29, 2018, now U.S. Pat. No. 10,817,090, issued on Oct. 27, 2020, which claims the benefit of the Korean Patent Application No. 10-2017-0083737 filed on Jun. 30, 2017, all of which are hereby incorporated by reference in their entirety as if fully set forth herein.

BACKGROUND

Field of the Disclosure

The present disclosure relates to a display device, and more particularly, to a display apparatus with integrated touch screen and a method of manufacturing the display apparatus. Although the present disclosure is suitable for a wide scope of applications, it is particularly suitable for preventing a short circuit between touch electrodes of a display apparatus with integrated touch screen and a method of manufacturing the same.

Description of the Background

With the advancement of information-oriented society, various requirements for display apparatuses for displaying an image are increasing. Field emission display apparatuses among the display apparatuses are apparatuses where a light emitting layer is provided between two electrodes and emits light with an electrical field generated between the two electrodes, thereby displaying an image.

As a type of field emission display apparatus, display apparatuses with integrated touch screen each include a touch screen panel for sensing a user touch. The display apparatuses with integrated touch screen enable a user to directly input information with a finger or a pen, and thus, are widely applied to navigation devices, portable terminals, home appliances, etc.

The display apparatuses with integrated touch screen each include a light emitting layer disposed on a lower substrate, an encapsulation layer disposed on the light emitting layer, and a plurality of touch electrodes disposed on the encapsulation layer and spaced apart from each other.

In the conventional display apparatus with integrated touch screen, an upper portion of each of the plurality of touch electrodes is covered by a single passivation layer. In this case, the passivation layer is inevitably disposed in a space between the touch electrodes spaced apart from each other, in addition to the upper portion of each of the touch electrodes. In this case, a short circuit can occur due to metal or particles remaining in the space between the touch electrodes, and it is difficult to repair such a short circuit.

SUMMARY

Accordingly, the present disclosure is directed to provide a display apparatus with integrated touch screen and a method of manufacturing the display apparatus that substantially obviate one or more problems due to limitations and disadvantages of the related art.

An aspect of the present disclosure is directed to provide a display apparatus with integrated touch screen and a method of manufacturing the display apparatus, which prevent short circuit between touch electrodes.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus with integrated touch screen including a light emitting layer disposed on a substrate, an encapsulation layer disposed on the light emitting layer, a plurality of touch electrodes disposed on the encapsulation and spaced apart from each other, and an upper PAC layer disposed on the plurality of touch electrodes. The upper PAC layer is patterned to be disposed on the plurality of touch electrodes.

In another aspect of the present disclosure, there is provided a method of manufacturing a display apparatus with integrated touch screen, the method including forming a light emitting layer on a substrate, forming an encapsulation layer on the light emitting layer, forming a plurality of touch electrodes on the encapsulation so that the plurality of touch electrodes are spaced apart from each other, forming an upper PAC layer on the plurality of touch electrodes, and patterning the upper PAC layer to be disposed on the plurality of touch electrodes.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION OF THE DISCLOSURE

Figure 1:
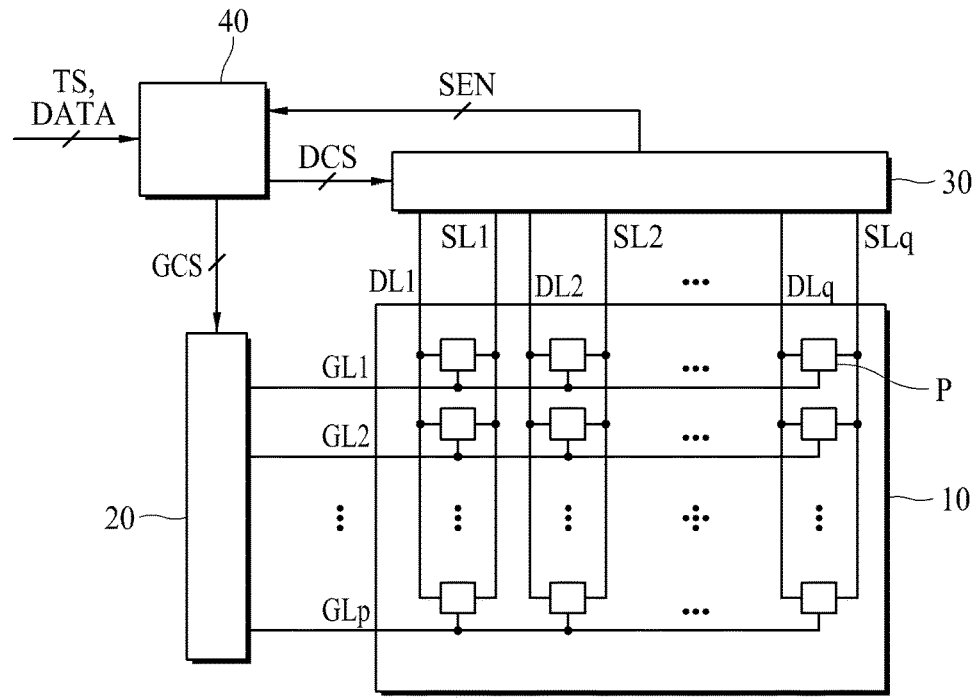
FIG. 1 is a conceptual block diagram of a display apparatus with integrated touch screen according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of a display apparatus with integrated touch screen according to the present disclosure will be described in detail with reference to the accompanying drawings.

Figure 2:
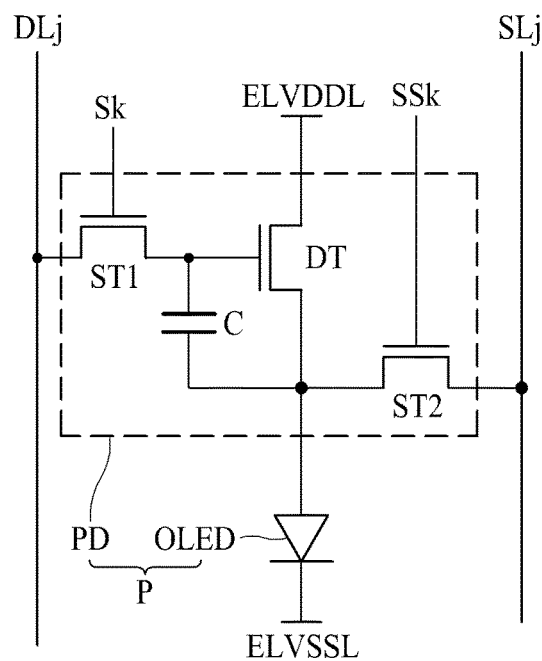
FIG. 2 is an internal circuit diagram of a pixel according to an aspect of the present disclosure.

FIG. 1 is a conceptual block diagram of a display apparatus with integrated touch screen according to an aspect of the present disclosure. FIG. 2 is an internal circuit diagram of a pixel according to an aspect of the present disclosure.

Referring to FIGS. 1 and 2, an organic light emitting display apparatus according to an aspect of the present disclosure may include a display panel 10, a gate driver 20, a data driver 30 and a timing controller 40.

The display panel 10 may include a display area and a non-display area provided near and outside the display area. The display area may be an area where pixels are provided to display an image. The non-display area may be an area which configures a border of the display panel 10 and protects the display area from an external impact. A plurality of gate lines GL1 to GLp (where p is a positive integer equal to or more than two), a plurality of data lines DL1 to DLq (where q is a positive integer equal to or more than two), and a plurality of sensing lines SL1 to SLq may be provided in the display panel 10. The data lines DL1 to DLq and the sensing lines SL1 to SLq may intersect the gate lines GL11 to GLp. The data lines DL1 to DLq and the sensing lines SL1 to SLq may be parallel to each other. The display panel 10 may include a lower substrate, on which the pixels P are provided, and an upper substrate which performs an encapsulation function for protecting the pixels P from external particles.

Each of the pixels may be connected to one corresponding gate line of the gate lines GL1 to GLp, one corresponding data line of the data lines DL1 to DLq, and one corresponding sensing line of the sensing lines SL1 to SLq. The pixels P, as in FIG. 2, may each include an organic light emitting diode OLED and a pixel driver PD which supplies a current to the organic light emitting diode OLED. In FIG. 2, for convenience of description, only a pixel P connected to a $j^{th}$ (where j is a positive integer satisfying $1 \leq j \leq q$) data line DLj, a $j^{th}$ sensing line SLj, a $k^{th}$ (where k is a positive integer satisfying $1 \leq k \leq p$) scan line (or a gate line) Sk, and a $k^{th}$ sensing signal line SSk is illustrated.

Referring to FIG. 2, the pixel P may include the organic light emitting diode OLED and the pixel driver PD that supplies a current to the organic light emitting diode OLED and the $j^{th}$ sensing line SLj.

The organic light emitting diode OLED may emit light with the current supplied through a driving transistor DT. An anode electrode of the organic light emitting diode OLED may be connected to a source electrode of the driving transistor DT, and a cathode electrode may be connected to a low level voltage line ELVSSL through which a low level voltage lower than a high level voltage is supplied.

The organic light emitting diode OLED may include the anode electrode, a hole transporting layer, an organic light emitting layer, an electron transporting layer, and the cathode electrode. When a voltage is applied to the anode electrode and the cathode electrode, a hole and an electron may respectively move to the organic light emitting layer through the hole transporting layer and the electron transporting layer and may be combined with each other in the organic light emitting layer to emit light.

The pixel driver PD may include the driving transistor DT, a first transistor ST1 controlled by a scan signal of the kth scan line Sk, a second transistor ST2 controlled by a sensing signal of the $k^{th}$ sensing signal line SSk, and a capacitor C. In a display mode, when the scan signal is supplied through the $k^{th}$ scan line Sk connected to the pixel P, the pixel driver PD may be supplied with a data voltage VDATA of the jth data line DLj connected to the pixel P and may supply a current of the driving transistor DT to the organic light emitting diode OLED, based on the data voltage VDATA. In a sensing mode, when the scan signal is supplied through the kth scan line Sk connected to the pixel P, the pixel driver PD may be supplied with a sensing voltage of the jth data line DLj connected to the pixel P and may supply the current of the driving transistor DT to the $j^{th}$ sensing line SLj connected to the pixel P.

The driving transistor DT may be provided between the high level voltage line ELVDDL and the organic light emitting diode OLED. The driving transistor DT may control a current flowing from the high level voltage line ELVDDL to the organic light emitting diode OLED, based on a voltage difference between a gate electrode and a source electrode of the driving transistor DT. The gate electrode of the driving transistor DT may be connected to a first electrode of the first transistor ST1, the source electrode may be connected to the anode electrode of the organic light emitting diode OLED, and a drain electrode may be connected to the high level voltage line ELVDDL through which the high level voltage is supplied.

The first transistor ST1 may be turned on by a kth scan signal of the kth scan line Sk and may supply a data voltage of the $j^{th}$ data line DLj to the gate electrode of the driving transistor DT. A gate electrode of the first transistor ST1 may be connected to the kth scan line Sk, a first electrode may be connected to the gate electrode of the driving transistor DT, and a second electrode may be connected to the $j^{th}$ data line DLj. The first transistor ST1 may be referred to as a scan transistor.

The second transistor ST2 may be turned on by a $k^{th}$ sensing signal of the $k^{th}$ sensing signal line SSk and may connect the $j^{th}$ sensing line SLj to the source electrode of the driving transistor DT. A gate electrode of the second transistor ST2 may be connected to the kth sensing signal line SSk, a first electrode may be connected to the $j^{th}$ sensing line SLj, and a second electrode may be connected to the source electrode of the driving transistor DT. The second transistor ST2 may be referred to as a sensing transistor.

The capacitor C may be provided between the gate electrode and the source electrode of the driving transistor DT. The capacitor C may store a difference voltage between a gate voltage and a source voltage of the driving transistor DT.

In FIG. 2, an example where the driving transistor DT and the first and second transistors ST1 and ST2 are each implemented as an N-type metal oxide semiconductor field effect transistor (MOSFET) has been described, but the present disclosure is not limited thereto. The driving transistor DT and the first and second transistors ST1 and ST2 may each be implemented as a P-type MOSFET. Also, the first electrode may be a source electrode, and the second electrode may be a drain electrode. However, the aspect of the disclosure is not limited thereto. In other aspects, the first electrode may be a drain electrode, and the second electrode may be a source electrode.

In the display mode, when the scan signal is supplied to the kth scan line Sk, the data voltage VDATA of the $j^{th}$ data line DLj may be supplied to the gate electrode of the driving transistor DT, and when the sensing signal is supplied to the kth sensing signal line SSk, an initialization voltage of the $j^{th}$ sensing line SLj may be supplied to the source electrode of the driving transistor DT. Therefore, in the display mode, a current of the driving transistor DT which flows according to a voltage difference between a voltage at the gate electrode and a voltage at the source electrode of the driving transistor DT may be supplied to the organic light emitting diode OLED, and the organic light emitting diode OLED may emit light with the current of the driving transistor DT. In this case, the data voltage VDATA may be a voltage generated by compensating for a threshold voltage and an electron mobility of the driving transistor DT, and thus, the current of the driving transistor DT does not depend on the threshold voltage and electron mobility of the driving transistor DT.

In the sensing mode, when the scan signal is supplied to the kth scan line Sk, a sensing voltage of the $j^{th}$ data line DLj may be supplied to the gate electrode of the driving transistor DT, and when the sensing signal is supplied to the $k^{th}$ sensing signal line SSk, the initialization voltage of the $j^{th}$ sensing line SLj may be supplied to the source electrode of the driving transistor DT. Also, when the sensing signal is supplied to the $k^{th}$ sensing signal line SSk, the second transistor ST2 may be turned on and may allow the current of the driving transistor DT, which flows according to the voltage difference between the voltage at the gate electrode and the voltage at the source electrode of the driving transistor DT, to flow to the $j^{th}$ sensing line SLj.

The gate driver 20 may be supplied with a gate driver control signal GCS from the timing controller 40 and may generate gate signals (or scan signals) according to the gate driver control signal GCS to supply the gate signals to the gate lines GL1 to GLp.

The data driver 30 may be supplied with a data driver control signal DCS from the timing controller 40 and may generate data voltages according to the data driver control signal DCS to supply the data voltages to the data lines DLI to DLq. Also, the data driver 30 may sense a voltage and current characteristic of each of the pixels P to generate sensing data SEN and may supply the sensing data SEN to the timing controller 40.

The timing controller 40 may be supplied with a timing signal TS for controlling an image display timing and digital video data DATA including color-based information for realizing an image from the outside. The timing signal TS and the digital video data DATA may be input to an input terminal of the timing controller 40, based on a predetermined protocol. Also, the timing controller 40 may be supplied with the sensing data SEN based on the voltage and current characteristic of each pixel P from the data driver 30.

The timing signal TS may include a vertical sync signal Vsync, a horizontal sync signal Hsync, a data enable signal DE, and a dot clock DCLK. The timing controller 40 may compensate for the digital video data DATA, based on the sensing data SEN.

The timing controller 40 may generate driver control signals for controlling operation timings of the gate driver 20, the data driver 30, a scan driver, and a sensing driver. The driver control signals may include the gate driver control signal GCS for controlling the operation timing of the gate driver 20, the data driver control signal DCS for controlling the operation timing of the data driver 30, a scan driver control signal for controlling the operation timing of the scan driver, and a sensing driver control signal for controlling the operation timing of the sensing driver.

The timing controller 40 may operate the data driver 30, the scan driver, and the sensing driver in one mode of the display mode and the sensing mode according to a mode signal. The display mode may be a mode in which the pixels P of the display panel 100 display an image, and the sensing mode may be a mode in which a current of a driving transistor DT of each of the pixels P of the display panel 100 is sensed. When a waveform of the scan signal and a waveform of the sensing signal supplied to each of the pixels P are changed in each of the display mode and the sensing mode, the data driver control signal DCS, a scan driver control signal, and a sensing driver control signal may also be changed in each of the display mode and the sensing mode. Therefore, the timing controller 40 may generate the data driver control signal DCS, the scan driver control signal, and the sensing driver control signal according to one mode of the display mode and the sensing mode.

The timing controller 40 may output the gate driver control signal GCS to the gate driver 110. The timing controller 40 may output compensation digital video data and the data driver control signal DCS to the data driver 30. The timing controller 130 may output the scan driver control signal to the scan driver. The timing controller 130 may output the sensing driver control signal to the sensing driver.

Moreover, the timing controller 40 may generate a mode signal for executing one corresponding mode, in which the data driver 30, the scan driver, and the sensing driver are driven, of the display mode and the sensing mode. The timing controller 40 may operate the data driver 30, the scan driver, and the sensing driver in one mode of the display mode and the sensing mode according to the mode signal.

Figure 3:
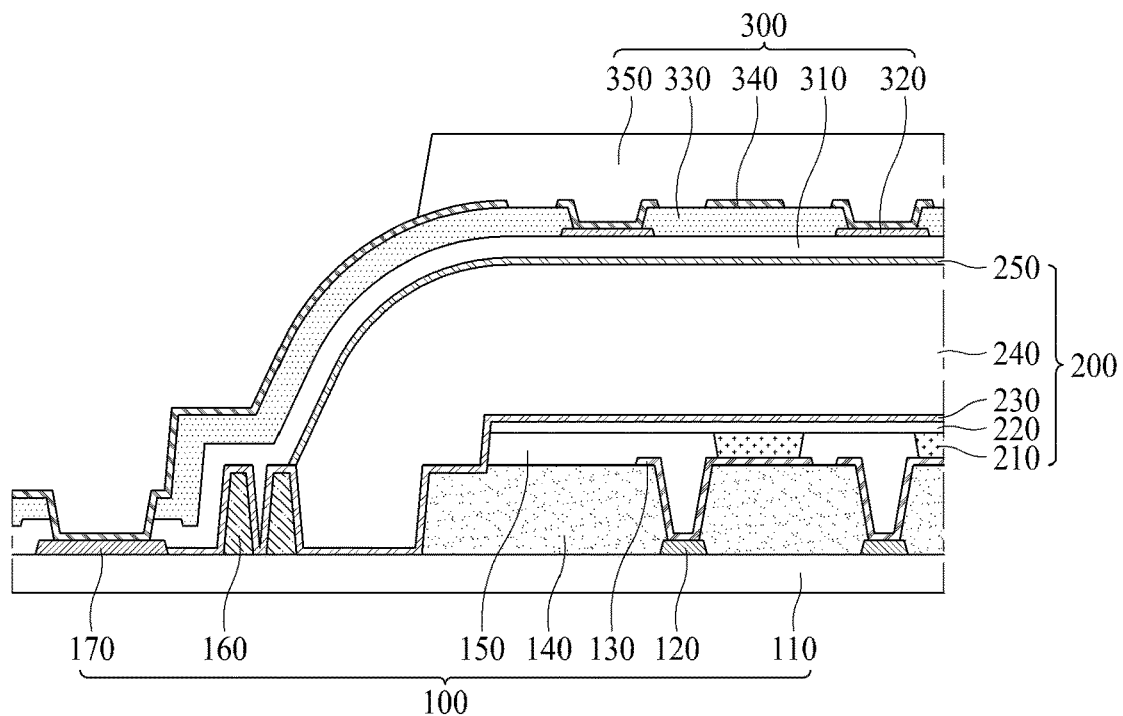
FIG. 3 is a cross-sectional view of a display apparatus with integrated touch screen according to an aspect of the present disclosure.

FIG. 3 is a cross-sectional view of a display apparatus with integrated touch screen according to an aspect of the present disclosure. The display apparatus with integrated touch screen according to an aspect of the present disclosure may include a lower substrate 100, a middle substrate 200, and a touch screen 300.

The lower substrate 100 may support the rear surface of the display apparatus with integrated touch screen. A thin film transistor (TFT) constituting a pixel may be provided on the lower substrate 100.

A polyimide layer 110 may be disposed on the lowermost end of the lower substrate 100. The polyimide layer 110 may have flexibility. The polyimide layer 110 may absorb an impact applied to the rear surface of the lower substrate 100.

A data line 120 may be disposed on the polyimide layer 110. The data line 120 may be provided in plurality, and each of the plurality of data lines may be disposed in each of pixel columns. The data line 120 may transfer a data voltage to a corresponding pixel.

An anode electrode 130 may be disposed on the data line 120. The anode electrode 130 may be disposed by units of pixels. The anode electrode 130 disposed in different pixels may not be connected to each other. The anode electrode 130 may be supplied with a data voltage through the data line 120.

The planarization layer 140 may be disposed on the polyimide layer 110. The planarization layer 140 may be disposed at a position at which the data line 120 is not disposed. The planarization layer 140 may a height higher than the data line 120. An upper surface of the planarization layer 140 may be planar, and the anode electrode 130 may be provided in a portion of the upper surface of the planarization layer 140. The anode electrode 130 may be provided on the planarization layer 140 in a state where the anode electrode 130 is not connected to and is disconnected from an adjacent anode electrode 130.

A bank 150 may be disposed on the anode electrode 130 and the planarization layer 140. The bank 150 may divide a plurality of pixels. The bank 150 may be formed of a material having good insulating properties. Therefore, the bank 500 prevents a short circuit between anode electrodes 130 disposed adjacent to each other.

A dam 160 may be disposed on the polyimide layer 110. The dam 160 may be disposed in an edge region of the lower substrate 100. The dam 160 prevents a material, having flowability among materials of the pixels, from passing over an edge of the lower substrate 100. Also, the dam 160 prevents materials, used to manufacture elements outside the pixels, from penetrating into a pixel area.

A pad part 170 may be disposed on the polyimide layer 110. The pad part 170 may be disposed outside the dam 160 in the edge region of the lower substrate 100. The pad part 170 may supply a touch electrode driving signal, supplied from the outside, to a touch electrode 340. Also, the pad part 170 may transfer a touch signal, which is generated by the touch electrode 340 and includes touch information, to a touch driver integrated circuit (IC) disposed outside the lower substrate 100.

The middle substrate 200 may be disposed on the lower substrate 100. The middle substrate 200 may implement a color of the display apparatus with integrated touch screen and protects the front surface of the lower substrate 100.

A light emitting layer 210 may be disposed on the anode electrode 130. The light emitting layer 210 may be disposed in each pixel. The light emitting layer 210 may emit light of a predetermined color by using an internal material or a means such as a color filter disposed thereon. The light emitting layer 210 may emit light, based on a level of a voltage or an external signal. Therefore, driving of the light emitting layer 210 may be controlled based on a voltage of the anode electrode 130. Particularly, if the display apparatus with integrated touch screen according to an aspect of the present disclosure is a self-emitting display apparatus such as an organic light emitting display apparatus, the light emitting layer 210 may be controlled to emit light having desired brightness with a data voltage which is transferred via the anode electrode 130 from the data line 120.

A cathode electrode 220 may be disposed on the bank 150 and the light emitting layer 210. The cathode electrode 220 may be provided as a single electrode in the plurality of pixels. The cathode electrode 220 may supply a reference voltage or a common voltage to the pixels.

A first passivation layer 230 may be disposed on the cathode electrode 230 in a region where the pixels are provided. Also, the first passivation layer 230 may be disposed on the polyimide layer 110 and the dam 160 in a region where the pad part 170 is disposed. The first passivation layer 230 protects TFTs provided in the pixels on the lower substrate 100. Also, the first passivation layer 230 prevents an external exposure of an upper portion of each of the polyimide layer 110 and the dam 160 in the region where the pad part 170 is disposed, thereby protecting the polyimide layer 110 and the dam 160.

An encapsulation layer 240 may be disposed on the first passivation layer 230. The encapsulation layer 240 may be provided in a pixel area. The encapsulation layer 240 protects the TFTs, provided in the pixels, from external foreign materials such as oxygen, water, etc.

A second passivation layer 250 may be disposed on the encapsulation layer 240. The second passivation layer 250 protects the encapsulation layer 240 from an external impact.

The touch screen 300 may be disposed on the middle substrate 200. The touch screen 300 may sense external touch information provided by a finger of a user or a touch pen. When the top of the touch screen 300 is touched, a capacitance generated in the encapsulation layer 240 disposed between the touch screen 300 and the lower substrate 100 may vary, and thus, touch information may be sensed.

Also, the touch screen 300 may display the external touch information on the pixel area.

A first insulation layer 310 may be disposed on the second passivation layer 250 in the pixel area. Also, the first insulation layer 310 may be disposed on the first passivation layer 230 in the region where the pad part 170 is disposed. The first insulation layer 310 prevents a short circuit between lines provided under the touch screen 300.

A touch line 320 may be disposed on the first insulation layer 310. The touch line 320 may be disposed in a direction parallel to the data line. The touch line 320 may supply a touch driving signal for driving the touch screen 300. Also, the touch line 320 may transfer touch information, sensed by the touch screen 300, to a touch IC chip. The touch line 320 may be formed of a material having high electrical conductivity.

A second insulation layer 330 may be disposed on the first insulation layer 310 and the touch line 320. The second insulation layer 330 prevents a short circuit between adjacent touch lines 320.

The touch electrode 340 may be provided on the touch line 320 and the second insulation layer 330. A touch electrode 340 disposed in a direction parallel to the data line may be disposed on the touch line 320. Also, a touch electrode 340 disposed in a direction parallel to a gate line may be disposed on the second insulation layer 330. The touch electrode 340 disposed in a direction parallel to the data line and the touch electrode 340 disposed in a direction parallel to the gate line may be connected to each other through a bridge electrode, and thus, may have a mesh structure.

A touch electrode 340 disposed in an edge of the pixel area may extend to an upper portion of the pad part 170 and may be electrically connected to the pad part 170. The touch electrodes 340 arranged in the mesh structure may sense a touch position of a touch which is performed in the pixel area. The touch electrode 340 may transfer touch information including the touch position to the pad part 170.

An upper photoactive compound (hereinafter referred to as "PAC") layer 350 may be disposed on the second insulation layer 330 and the touch electrode 340. The upper PAC layer 350 may be formed of a polymer material which has a high insulation property and does not react with an external material. The upper PAC layer 350 may cover the second insulation layer 330 and the touch electrode 340 so as not to be externally exposed. The upper PAC layer 350 protects the second insulation layer 330 and the touch electrode 340 from external foreign materials such as oxygen, water, etc.

Figure 4:
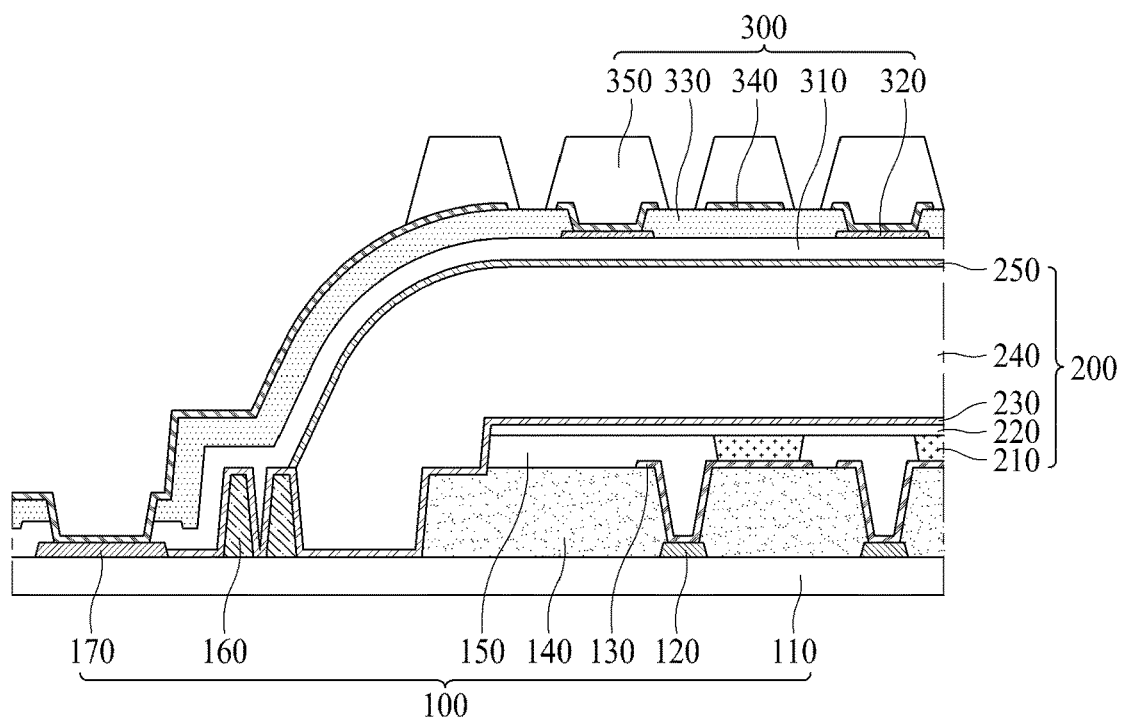
FIG. 4 is a cross-sectional view of a display apparatus with integrated touch screen according to another aspect of the present disclosure.

FIG. 4 is a cross-sectional view of a display apparatus with integrated touch screen according to another aspect of the present disclosure. Except for the upper PAC layer 350, the display apparatus with integrated touch screen according to another aspect of the present disclosure has the same structure as that of the display apparatus with integrated touch screen according to an aspect of the present disclosure.

The display apparatus with integrated touch screen according to another aspect of the present disclosure may include an upper PAC layer 350, and the upper PAC layer 350 may be patterned so as to be disposed on a plurality of touch electrodes 340. The upper PAC layer 350 may overlap upper portions of the plurality of touch electrodes 340. A shape of a plane of the upper PAC layer 350 may be the same as that of a plane of each of the plurality of touch electrodes 340. A portion of the upper PAC layer 350 may be provided in a region adjacent to a region where the plurality of touch electrodes 340 are provided, so as to completely cover the plurality of touch electrodes 340. The upper PAC layer 350 is formed to be cut at least one of spaces between the plurality of touch electrodes 340.

If the touch electrodes 340 are connected to each other by foreign materials such as remaining water or metal in a portion where a connection is not fundamentally needed, a short circuit can occur between the touch electrodes 340. Even when a touch is applied to only one touch electrode 340, all of short-circuited touch electrodes 340 may transfer touch information to the touch driver IC. Therefore, due to the short circuit, the touch driver IC may recognize that the touch is applied to a whole region where touch electrodes 340 electrically connected to each other are disposed. Accordingly, the touch screen 300 cannot accurately sense a touch position.

For above-described reason, when the touch electrodes 340 are not connected to each other except a portion connected to a bridge electrode for an electrical connection between two crossing touch electrodes 340, the touch screen 300 may accurately sense a touch position. That is, there should not be foreign materials such as water or metal remaining on the second insulation layer 330. The foreign materials such as water or metal remaining on the second insulation layer 330 should be removed in a manufacturing process. Also, the display apparatus with integrated touch screen according to the present disclosure may be finished, and then, the upper PAC layer 350 prevents foreign materials such as water or metal from penetrating into an upper portion of the second insulation layer 330.

Despite such a process, foreign materials such as metal can occur on the second insulation layer 330. Therefore, the foreign materials such as metal remaining on the second insulation layer 330 may be removed through an etching process. The etching process may use a dry etching process of removing foreign materials through a chemical reaction between a plasma gas and a nitric acid-based gas or a wet etching process using hydrofluoric acid (HF) or xenon difluoride ($XeF_2$). When the etching process is applied to an upper portion of the second insulation layer 330, foreign materials such as metal remaining between the touch electrodes 340 may be removed. Also, when the foreign materials such as metal remaining between the touch electrodes 340 are removed, a defect caused by short circuit between the touch electrodes 340 may be repaired.

If the upper PAC layer 350 is provided, the upper PAC layer 350 protects layers or elements thereunder in a dry etching process or a purge process. Therefore, if the upper PAC layer 350 is provided, despite performing the dry etching process or the purge process in a portion on the upper PAC layer 350, it is not easy to remove the layers or the elements under the upper PAC layer 350. For this reason, if the upper PAC layer 350 is disposed on the second insulation layer 330, it is not easy to remove foreign materials such as water or metal remaining on the second insulation layer 330. That is, if the upper PAC layer 350 is provided, it is not easy to repair short circuit which occurs between the touch electrodes 340 due to foreign materials such as metal remaining in a manufacturing process of forming the touch electrodes 340.

In the upper PAC layer 350 according to another aspect of the present disclosure, the upper PAC layer 350 may not be provided between the plurality of touch electrodes 340. An upper portion of the second insulation layer 330 may be exposed at a portion where the upper PAC layer 350 is not provided. Therefore, in a case where a dry etching process or a purge process is performed in a portion on the second insulation layer 330, the dry etching process or the purge process may be directly applied to a portion at which the upper portion of the second insulation layer 330 is exposed. Therefore, foreign materials such as metal remaining between the plurality of touch electrodes 340 may be easily removed from the portion at which the upper portion of the second insulation layer 330 is exposed. As a result, short circuit between the touch electrodes 340 caused by metal remaining in a manufacturing process may be easily repaired by applying the dry etching process or the purge process even after forming the upper PAC layer 350.

The upper PAC layer 350 according to another aspect of the present disclosure may not be disposed between the plurality of touch electrodes 340. Therefore, the second insulation layer 330 for electrically insulating the plurality of touch electrodes 340 may be externally exposed. That is, when the upper PAC layer 350 is patterned, the second insulation layer 330 may be an uppermost layer of a product in a portion where the upper PAC layer 350 is not provided.

In this case, in addition to the upper PAC layer 350, the second insulation layer 330 may also protect layers thereunder from external foreign materials. Therefore, as in case where the upper PAC layer 350 is not patterned, the second insulation layer 330 may identically perform a protection function. Also, if the upper PAC layer 350 is provided to expose a portion of the second insulation layer 330, an average thickness of the upper PAC layer 350 is reduced. Accordingly, an additional effect where a touch sensitivity of a touch applied to the touch electrodes 340 is enhanced is obtained.

Figure 5:
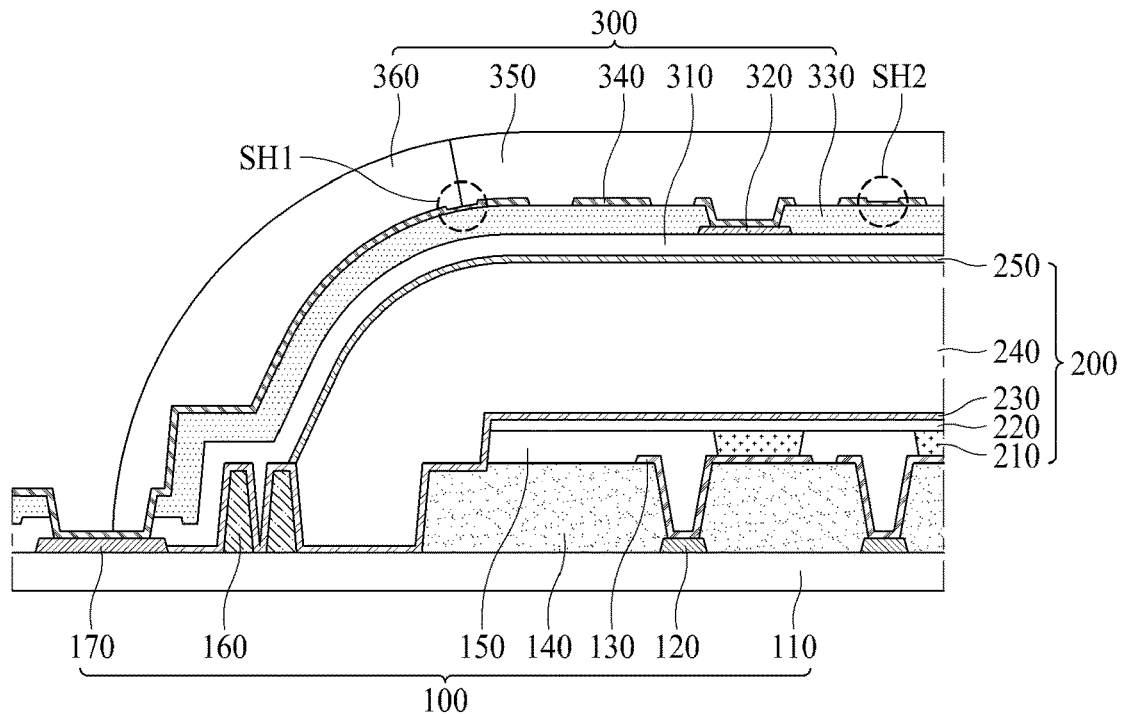
FIGS. 5 to 7 are cross-sectional views for describing a method of manufacturing a display apparatus with integrated touch screen according to another aspect of the present disclosure.
Figure 6:
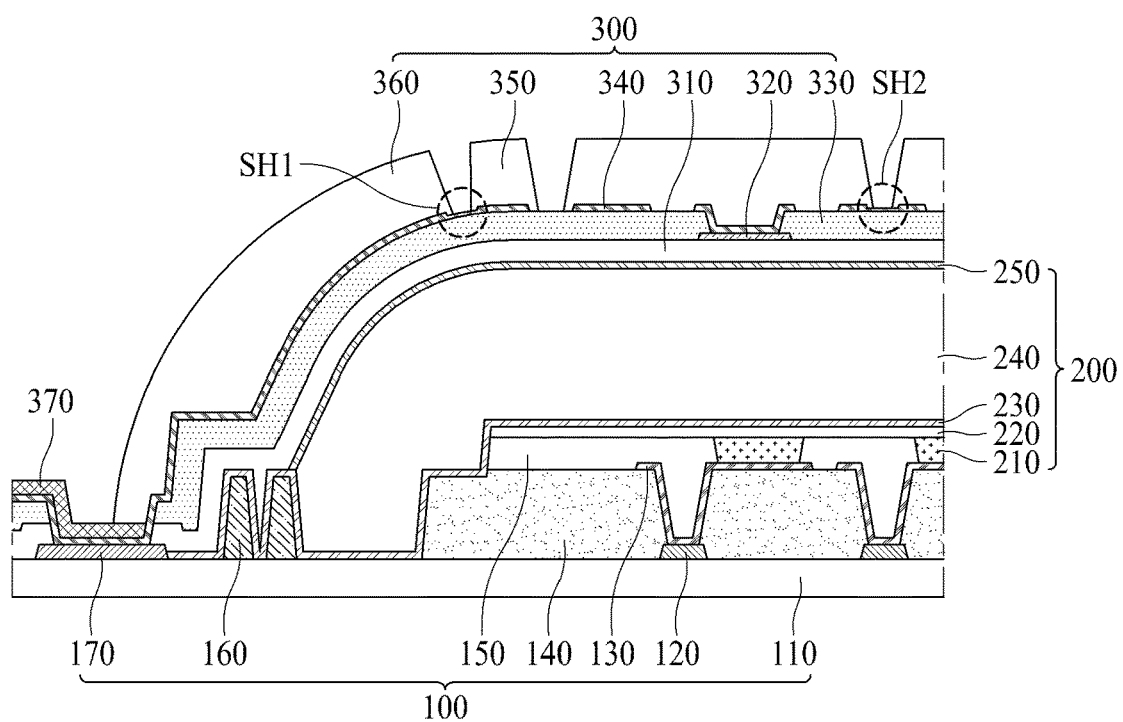
Figure 7:
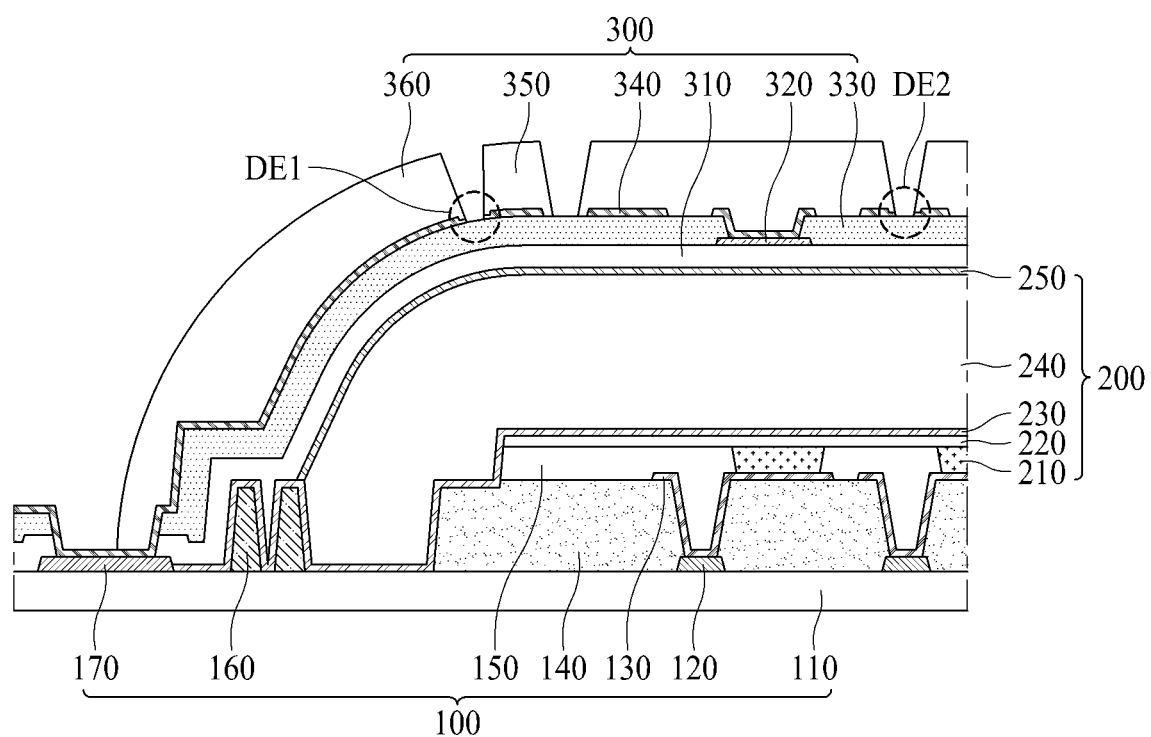

FIGS. 5 to 7 are cross-sectional views for describing a method of manufacturing a display apparatus with integrated touch screen according to another aspect of the present disclosure.

Before describing the manufacturing method, the display apparatus with integrated touch screen according to another aspect of the present disclosure will be first described with reference to FIG. 7. The display apparatus with integrated touch screen according to another aspect of the present disclosure may further include a pad part 170, which is disposed in an edge region of a lower substrate 100 and is electrically connected to a touch electrode 340, and a touch electrode PAC layer 360 which covers an upper portion of the touch electrode 340 connected to the pad part 170.

The touch electrode PAC layer 360 may be formed of a polymer material which is good in insulation and does not react with an external material. The touch electrode PAC layer 360 may be formed through the same process by using the same material as that of the upper PAC layer 350. The touch electrode PAC layer 360 may cover the touch electrode 340 connected to the pad part 170 so as not to be externally exposed. The touch electrode PAC layer 360 protects the touch electrode 340 connected to the pad part 170 from external foreign materials such as oxygen, water, etc.

The display apparatus with integrated touch screen according to another aspect of the present disclosure may cover the touch electrode 340 connected to the pad part 170 by using the touch electrode PAC layer 360. Therefore, a connection between the touch electrode 340 and the pad part 170 can be more reinforced. Also, an electrical signal may be stably transferred between the touch electrode 340 and the pad part 170 without being hindered.

An upper PAC layer 350 of the display apparatus with integrated touch screen according to another aspect of the present disclosure may be removed from portions DE1 and DE2 capable of causing short circuit between a plurality of touch electrodes 340. Each of the portions DE1 and DE2 capable of causing short circuit may be a space between touch electrodes 340 disposed adjacent to each other on the same layer among the plurality of touch electrodes 340. Also, each of the portions DE1 and DE2 capable of causing short circuit may be a space between touch electrodes 340 which should not be electrically connected to each other for normal driving of the touch electrodes 240. Also, each of the portions DE1 and DE2 capable of causing short circuit may be a region where metal easily remains in a manufacturing process.

In the display apparatus with integrated touch screen according to another aspect of the present disclosure, the upper PAC layer 350 may be selectively patterned so that the upper PAC layer 350 is not provided on the portions DE1 and DE2 capable of causing short circuit. Accordingly, a problem where metal remaining in the portions DE1 and DE2 capable of causing short circuit cannot be removed by the upper PAC layer 350 is solved. Also, by minimizing a patterned portion, a problem caused by short circuit is solved.

The method of manufacturing the display apparatus with integrated touch screen may include forming a light emitting layer 210 on a substrate, forming an encapsulation layer 240 on the light emitting layer 210, forming the plurality of touch electrodes 340 on the encapsulation layer 240 so that the plurality of touch electrodes 340 are spaced apart from each other, and forming the upper PAC layer 350 on the plurality of touch electrodes 340. In this case, as in FIG. 5, the upper PAC layer 350 may be formed of a single layer. In this case, metal between adjacent touch electrodes 340 remains in a process of forming the touch electrodes 340, and due to this, short circuit portions SH1 and SH2 occur.

The method of manufacturing the display apparatus with integrated touch screen, as in FIG. 6, may include patterning the upper PAC layer 350 so that the upper PAC layer 350 is formed on the plurality of touch electrodes 340.

Through a patterning operation of patterning the upper PAC layer 350, the upper PAC layer 350 may be patterned on the plurality of touch electrodes 340 and in a region adjacent to the touch electrodes 340. The upper PAC layer 350 may be patterned so as to be cut between adjacent touch electrodes 340. For example, the upper PAC layer 350 may be patterned so as to be cut on the short circuit portions SH1 and SH2.

Therefore, the upper PAC layer 350 may not be formed on the short circuit portions SH1 and SH2. Since the upper PAC layer 350 is not formed on the short circuit portions SH1 and SH2, a problem of short circuit is easily solved by removing metal of the short circuit portions SH1 and SH2.

At this time, in the patterning operation of patterning the upper PAC layer 350, the second insulation layer 330 for electrically disconnecting the plurality of touch electrodes 340 may be externally exposed. The second insulation layer 330 may be formed of a material which prevents penetration of external foreign materials, has a strong impact absorbing force, and is good in insulation.

Therefore, despite patterning the upper PAC layer 350, a problem where a portion of each of the touch electrodes 340 is externally exposed is solved, and foreign materials cannot penetrate into the touch electrodes 340.

If the short circuit portions SH1 and SH2 where short circuit occurs are exposed, a method for solving a problem of short circuit of the short circuit portions SH1 and SH2 is needed. The method of manufacturing the display apparatus with integrated touch screen according to an aspect of the present disclosure may further include, after patterning the upper PAC layer 350, dry-etching a portion on the upper PAC layer 350 to remove metal or foreign materials remaining between the plurality of touch electrodes 340 on the second insulation layer 330.

When a dry etching process is performed at a region where the upper PAC layer 350 is formed, only a portion of an upper portion of the upper PAC layer 350 can be etched, and the touch electrodes 340 under the upper PAC layer 350 is protected without being etched. Also, when a dry etching process is performed, metals remaining in a region where the upper PAC layer 350 is not formed are entirely removed. Accordingly, metals remaining in the short circuit portions SH1 and SH2 are completely removed, and thus, a problem of the short circuit can be resolved.

In the method of manufacturing the display apparatus with integrated touch screen according to an aspect of the present disclosure, only metals remaining in the short circuit portions SH1 and SH2 may be removed through a simple process of performing dry etching in an upper portion, thereby protecting the touch electrodes 340 and solving a problem of short circuit.

Moreover, in the method of manufacturing the display apparatus with integrated touch screen according to an aspect of the present disclosure, the pad part 170 disposed on the lower substrate 100 and electrically connected to the touch electrodes 340 may be formed in an operation of forming the plurality of touch electrodes 340 spaced apart from each other, and the touch electrode PAC layer 360 covering upper portions of the touch electrodes 340 connected to the pad part 170 may be formed in an operation of forming the upper PAC layer 350.

In case where the touch electrode PAC layer 360 is not provided, the touch electrodes 340 may be exposed at an edge of the display apparatus with integrated touch screen. In this case, the touch electrodes 340 connected to the pad part 170 are vulnerable to an external impact or penetration of foreign materials. Since the touch electrode PAC layer 360 is further provided, the touch electrodes 340 connected to the pad part 170 are more certainly protected from an external impact or penetration of foreign materials, and a signal is transferred or received between the pad part 170 and the touch electrodes 340 without an error.

Moreover, in the method of manufacturing the display apparatus with integrated touch screen according to an aspect of the present disclosure, a halftone PAC layer 370 may be formed on the pad part 170 in an operation of forming the upper PAC layer 350. The halftone PAC layer 370 may define a layer which is formed to have a thickness corresponding to half of a thickness of a general PAC layer by using a halftone mask that deposits only half of a material forming a thin layer and filters the other half of the material. As illustrated in FIG. 6, the halftone PAC layer 370 may be formed to have a thickness which is thinner than the upper PAC layer 350 and the touch electrode PAC layer 360. The halftone PAC layer 370 may be formed of the same material as that of the upper PAC layer 350 and the touch electrode PAC layer 360 through the same process.

If the halftone PAC layer 370 is not provided, the pad part 170 is damaged in a process of removing metals remaining in the short circuit portions SH1 and SH2 like a process of performing dry etching in an upper portion. The pad part 170 may be externally exposed in a finished product, but in the process of removing the metals remaining in the short circuit portions SH1 and SH2, the pad part 170 may not be exposed. Therefore, in an aspect of the present disclosure, the halftone PAC layer 370 may be formed on the pad part 170, thereby protecting the pad part 170 so as not to be damaged in the process of removing the metals remaining in the short circuit portions SH1 and SH2.

In a finished display apparatus with integrated touch screen, in only a case where the pad part 170 is externally exposed, the pad part 170 may be supplied with a signal from the outside and may transfer a signal, generated by the display apparatus with integrated touch screen, to the outside. In an aspect of the present disclosure, the manufacturing method may further include, after patterning the upper PAC layer 350, performing dry etching in an upper portion to remove the halftone PAC layer 370.

In this case, the halftone PAC layer 370 may be formed thinner in thickness than the upper PAC layer 350 and the touch electrode PAC layer 360, and thus, the halftone PAC layer 370 may be removed through a dry etching process of removing the metals remaining in the short circuit portions SH1 and SH2.

Therefore, by removing the halftone PAC layer 370 through the dry etching process of removing the metals remaining in the short circuit portions SH1 and SH2, the pad part 170 may be externally opened without adding a separate process. As a result, the pad part 170 is protected in the dry etching process of removing metal, and in a finished product, the pad part 170 may be opened without the additional cost, thereby enhancing manufacturing efficiency.

In the display apparatus with integrated touch screen according to the aspects of the present disclosure, by removing metal or particles remaining in the space between the touch electrodes, short circuit between the touch electrodes is prevented.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus with integrated touch screen, comprising:
    a light emitting layer disposed over a substrate, wherein the substrate includes a display area including pixels and a non-display area adjacent to the display area;
    a first passivation layer disposed over the light emitting layer;
    an encapsulation layer disposed over the first passivation layer;
    a second passivation layer disposed over the encapsulation layer;
    a first insulation layer on the second passivation layer;
    a touch line or bridge electrode on the first insulation layer,
    a second insulation layer on the touch line or the bridge electrode;
    a plurality of touch electrodes disposed on the second touch insulation layer, and including a first touch electrode and a second touch electrode spaced apart from the first touch electrode;
    a upper photoactive compound (PAC) layer disposed on the first touch electrode and the second touch electrode, and covering the first touch electrode and the second touch electrode; and
    a dam disposed in the non-display area of the substrate, wherein the second insulation layer disposed on a side surface of the encapsulation layer overlapping the non-display area, and overlaps the dam.

2. The display apparatus of claim 1, wherein the touch line and the plurality of touch electrodes are extended to the non-display area along the side surface of the encapsulation layer overlapping the non-display area, and overlaps the dam.

3. The display apparatus of claim 1, wherein the upper photoactive compound (PAC) layer is cut to have at least one of spaces between the plurality of touch electrodes.

4. The display apparatus of claim 1, wherein the upper photoactive compound (PAC) layer is not disposed between the plurality of touch electrodes.

5. The display apparatus of claim 4, wherein an upper portion of the second insulation layer is exposed at a portion where the upper photoactive compound (PAC) layer is not disposed.

6. The display apparatus of claim 1, further comprising a pad part disposed at the non-display area of the substrate, wherein the pad part is electrically connected to the first touch electrode and the second touch electrode.

7. The display apparatus of claim 6, wherein the first touch electrode or the second touch electrode disposed in an edge of the display area extend to an upper portion of the pad part.

8. The display apparatus of claim 6, further comprising a data line transferring a data voltage to the pixels,
wherein the pad part includes the same material as the data line.

9. The display apparatus of claim 1, wherein the first touch electrode and second touch electrode extend to the upper portion of the dam in the non-display of the substrate.

10. The display apparatus of claim 3, wherein an end part of the upper photoactive compound (PAC) layer is provided in the non-display area.

11. The display apparatus of claim 1, wherein the first passivation layer and the second passivation layer are disposed on the dam.

* * * * *